United States Patent
Miyamura

(10) Patent No.: US 11,799,228 B2
(45) Date of Patent: Oct. 24, 2023

(54) CONNECTOR COMPRISING A FRONT WALL PORTION OF A HOUSING FORMED WITH A DETECTION HOLE

(71) Applicants: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(72) Inventor: Tetsuya Miyamura, Mie (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 68 days.

(21) Appl. No.: 17/610,428

(22) PCT Filed: May 11, 2020

(86) PCT No.: PCT/JP2020/018758
§ 371 (c)(1),
(2) Date: Nov. 10, 2021

(87) PCT Pub. No.: WO2020/235366
PCT Pub. Date: Nov. 26, 2020

(65) Prior Publication Data
US 2022/0216636 A1    Jul. 7, 2022

(30) Foreign Application Priority Data
May 23, 2019    (JP) .................................. 2019-096854

(51) Int. Cl.
*H01R 13/424*    (2006.01)

(52) U.S. Cl.
CPC .................................. *H01R 13/424* (2013.01)

(58) Field of Classification Search
CPC .. H01R 13/424; H01R 13/426; H01R 13/428; H01R 13/4362; H01R 13/4365; H01R 13/4368
(Continued)

(56) References Cited

U.S. PATENT DOCUMENTS 5,660,555 A * 8/1997 Ito ..................... H01R 13/5221
439/281
5,694,043 A    12/1997 Kodama
(Continued)

FOREIGN PATENT DOCUMENTS

| JP | 2011-023202 A | 2/2011 |
| JP | 2013-145635 A | 7/2013 |
| JP | 2020-034299 A | 3/2020 |

*Primary Examiner* — Harshad C Patel
(74) *Attorney, Agent, or Firm* — Venjuris, P.C.

(57) ABSTRACT

It is aimed to prevent the damage and deformation of a terminal fitting. A connector is provided with a housing including a terminal accommodation chamber, and a terminal fitting including a tube portion and a resilient contact piece accommodated in the tube portion, the terminal fitting being inserted into the terminal accommodation chamber. A front wall portion of the housing is formed with a tab insertion hole into which a tab (T) of a mating terminal is inserted to enter the tube portion from front and contact the resilient contact piece. A left front plate portion is formed forward of the resilient contact piece in the terminal fitting. The front wall portion of the housing is formed with a detection hole open separately from the tab insertion hole. The detection hole is disposed at a position facing the left front plate portion in the front wall portion.

5 Claims, 8 Drawing Sheets

(58) Field of Classification Search
USPC .......................................................... 439/744
See application file for complete search history.

(56) References Cited

U.S. PATENT DOCUMENTS

| | | | | |
|---|---|---|---|---|
| 5,890,932 | A * | 4/1999 | Muta | H01R 13/4223 |
| | | | | 439/682 |
| 6,083,033 | A * | 7/2000 | Yamamoto | H01R 13/50 |
| | | | | 439/381 |
| 6,190,195 | B1 * | 2/2001 | Yamamoto | H01R 13/631 |
| | | | | 439/682 |
| 6,261,131 | B1 * | 7/2001 | Kuroda | H01R 12/7088 |
| | | | | 439/732 |
| 6,354,867 | B1 | 3/2002 | Tachi et al. | |
| 2004/0157503 | A1 | 8/2004 | Fujii | |
| 2006/0172595 | A1 | 8/2006 | Noro et al. | |
| 2015/0037995 | A1 | 2/2015 | Saitou et al. | |
| 2015/0380853 | A1 | 12/2015 | Chonan et al. | |

\* cited by examiner

CONNECTOR COMPRISING A FRONT WALL PORTION OF A HOUSING FORMED WITH A DETECTION HOLE

CROSS REFERENCE TO RELATED APPLICATIONS

This application is a national phase of PCT application No. PCT/JP2020/018758, filed on 11 May 2020, which claims priority from Japanese patent application No. 2019-096854, filed on 23 May 2019, all of which are incorporated herein by reference.

TECHNICAL FIELD

The present disclosure relates to a connector.

BACKGROUND

Patent Document 1 discloses a connector in which a terminal fitting is inserted in a terminal accommodation chamber of a connector housing. An insertion hole for the insertion of a tab of a mating terminal into the terminal accommodation chamber is open in a front wall portion of the connector housing. The tab inserted into the insertion hole contacts an electrical contact portion in a front end part of the terminal fitting.

PRIOR ART DOCUMENT

Patent Document

Patent Document 1: JP H09-043299 A

SUMMARY OF THE INVENTION

Problems to be Solved

When continuity inspection is carried out in the connector of Patent Document 1, an inspection pin is inserted into the insertion hole and the tip of the inspection pin is butted against the electrical contact portion. The electrical contact portion is an important part in terms of functions as the terminal fitting. Thus, if the inspection pin is butted against the electrical contact portion, there is a concern that the electrical contact portion may be deformed and the terminal fitting cannot exhibit original functions.

A connector of the present disclosure was completed on the basis of the above situation and aims to prevent the damage and deformation of a terminal fitting.

Means to Solve the Problem

The present disclosure is directed to a connector with a housing including a terminal accommodation chamber, and a terminal fitting including a tube portion and a resilient contact piece accommodated in the tube portion, the terminal fitting being inserted into the terminal accommodation chamber, wherein a front wall portion of the housing is formed with a tab insertion hole, a tab of a mating terminal being inserted into the tab insertion hole to enter the tube portion from front and contact the resilient contact piece, a front plate portion is formed forward of the resilient contact piece in the terminal fitting, the front wall portion of the housing is formed with a detection hole open separately from the tab insertion hole, and the detection hole is disposed at a position facing the front plate portion in the front wall portion.

Effect of the Invention

According to the present disclosure, it is possible to prevent the damage and deformation of a terminal fitting.

DETAILED DESCRIPTION TO EXECUTE THE INVENTION

Description of Embodiments of Present Disclosure

Figure 1:
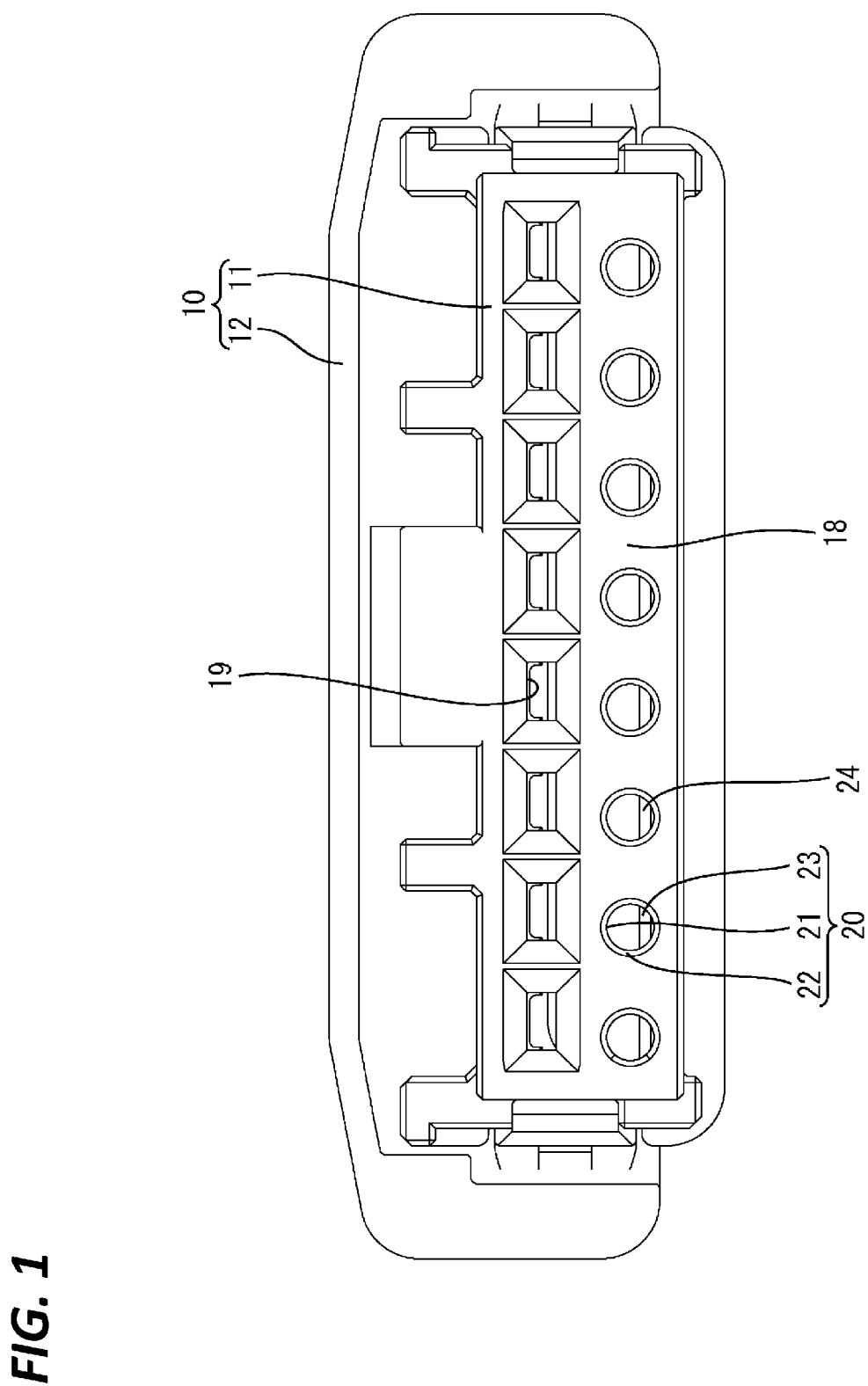
FIG. 1 is a front view of a connector of a first embodiment.

First, embodiments of the present disclosure are listed and described.

(1) The connector of the present disclosure is provided with a housing including a terminal accommodation chamber, and a terminal fitting including a tube portion and a resilient contact piece accommodated in the tube portion, the terminal fitting being inserted into the terminal accommodation chamber, wherein a front wall portion of the housing is formed with a tab insertion hole, a tab of a mating terminal being inserted into the tab insertion hole to enter the tube portion from front and contact the resilient contact piece, a front plate portion is formed forward of the resilient contact piece in the terminal fitting, the front wall portion of the housing is formed with a detection hole open separately from the tab insertion hole, and the detection hole is disposed at a position facing the front plate portion in the front wall portion.

According to the configuration of the present disclosure, a detection pin is inserted into the detection hole and brought into contact with the front plate portion at the time of continuity inspection. Since the front plate portion is located forward of the resilient contact piece, there is no possibility that the detection pin contacts the resilient contact piece. Since the detection hole is open separately from the tab insertion hole and the tab insertion hole and the detection hole do not communicate with each other, there is also no possibility that the detection pin inserted into the detection hole erroneously enters the tab insertion hole to contact resilient contact piece. Therefore, according to the connector of the present disclosure, the damage and deformation of the terminal fitting due to the contact of the detection pin can be prevented.

(2) Preferably, the front plate portion is cantilevered from a plate-like portion constituting the tube portion, and the detection hole is disposed eccentrically from a center of a cross-section of the tube portion orthogonal to an entering direction of the tab. According to this configuration, since the detection hole is eccentric toward the plate-like portion from the center of the cross-section of the tube portion orthogonal to the entering direction of the tab, i.e. a center of the tube portion in a front view, the detection pin pushes not a part of the front plate portion near an extending end part, but a part of the front plate portion on the side of a base end part connected to the plate-like portion. Therefore, there is no possibility that the front plate portion is deformed rearward even if being pushed by the detection pin.

(3) In (2), preferably, the detection hole is facing a region of the front plate portion including a base end part connected to the plate-like portion. According to this configuration, since the detection pin can push the base end part of the front plate portion connected to the plate-like portion, the rearward deformation of the front plate portion can be reliably prevented when the front plate portion is pushed by the detection pin.

(4) Preferably, the front plate portion covers at least a part of the resilient contact piece from front. According to this configuration, even in a state where the terminal fitting is located outside the terminal accommodation chamber, the damage and deformation of the resilient contact piece due to the interference of an external matter can be prevented.

(5) Preferably, a rear end of the detection hole is open to face a region of the terminal fitting, where the front plate portion is not formed, in a front-rear direction, and at least a rear end part of an inner peripheral surface of the detection hole is formed with a guide slope inclined to approach the front plate portion toward a rear side. According to this configuration, the detection pin can be reliably inserted into the detection hole by making an inner diameter of the front end of the detection hole larger than the detection pin. The detection pin inserted into the detection hole can reliably contact the front plate portion by sliding in contact with the guide slope.

(6) In (5), preferably, the terminal fitting is retained by a resiliently displaceable locking lance formed in the terminal accommodation chamber, and the guide slope is formed by recessing an inner surface of the terminal accommodation chamber. A clearance is unavoidably formed in the front-rear direction between the terminal fitting and the resiliently displaceable locking lance, and the terminal fitting is displaceable in the front-rear direction by as much as this clearance. Focusing on this point, the guide slope is formed by recessing the inner surface of the terminal accommodation chamber. According to this configuration, the detection pin can increase a contact area with the front plate portion by sliding in contact with the guide slope in the process of the terminal fitting moving rearward by as much as the clearance between the terminal fitting and the locking lance by being pushed by the detection pin.

DETAILS OF EMBODIMENTS OF PRESENT DISCLOSURE

First Embodiment

Figure 2:
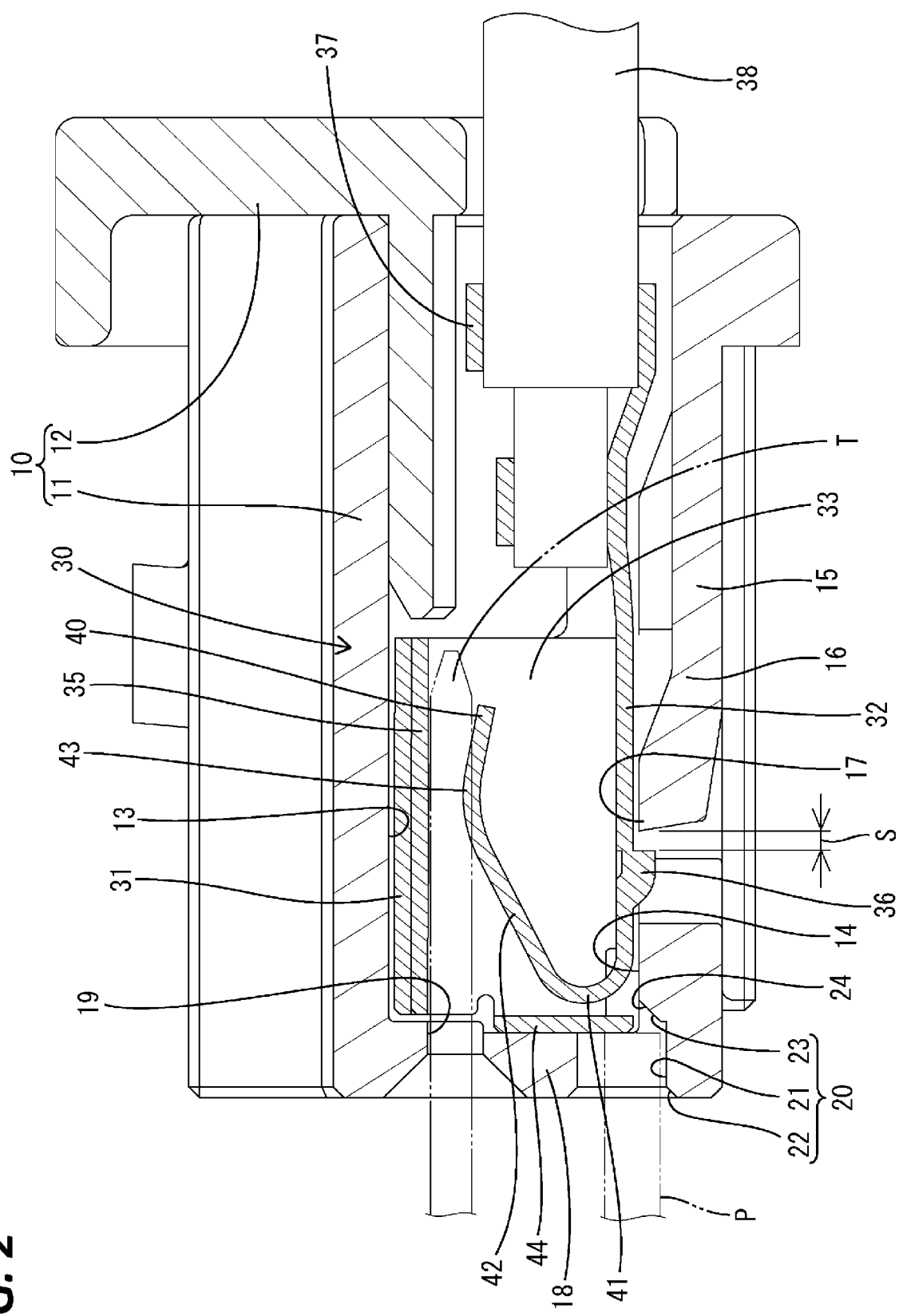
FIG. 2 is a side view in section showing a state where a detection pin inserted into a detection hole is in contact with a front plate portion of a terminal fitting.
Figure 3:
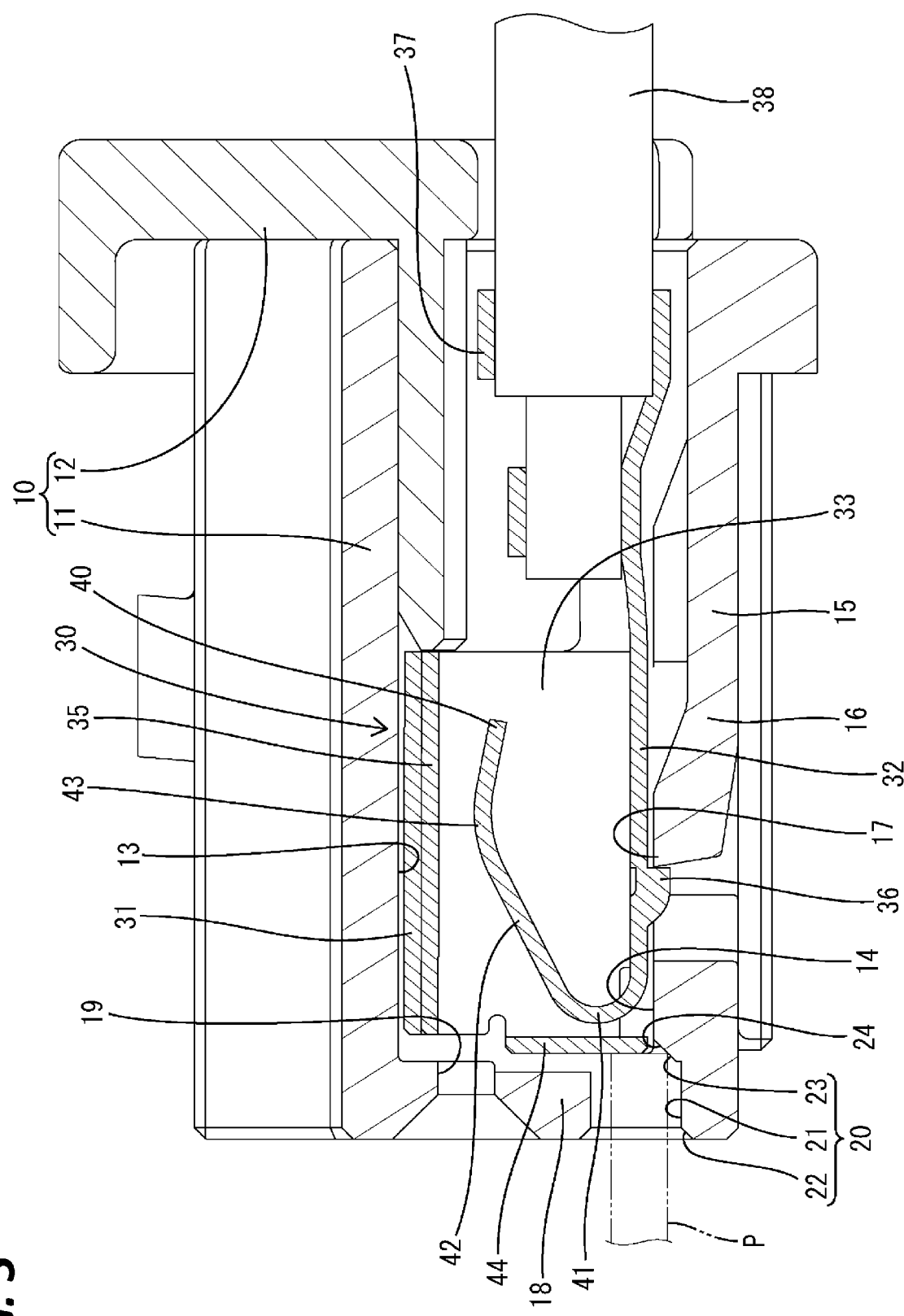
FIG. 3 is a side view in section showing a state of the terminal fitting pushed rearward by the detection pin.

A first specific embodiment of a connector of the present disclosure is described with reference to FIGS. 1 to 5. In the first embodiment, a left side in FIGS. 2 and 3 is defined as a front side concerning a front-rear direction. Upper and lower sides shown in FIGS. 1 to 5 are directly defined as upper and lower sides concerning a vertical direction. Left and right sides shown in FIGS. 1 and 5 are directly defined as left and right sides concerning a lateral direction.

Figure 4:
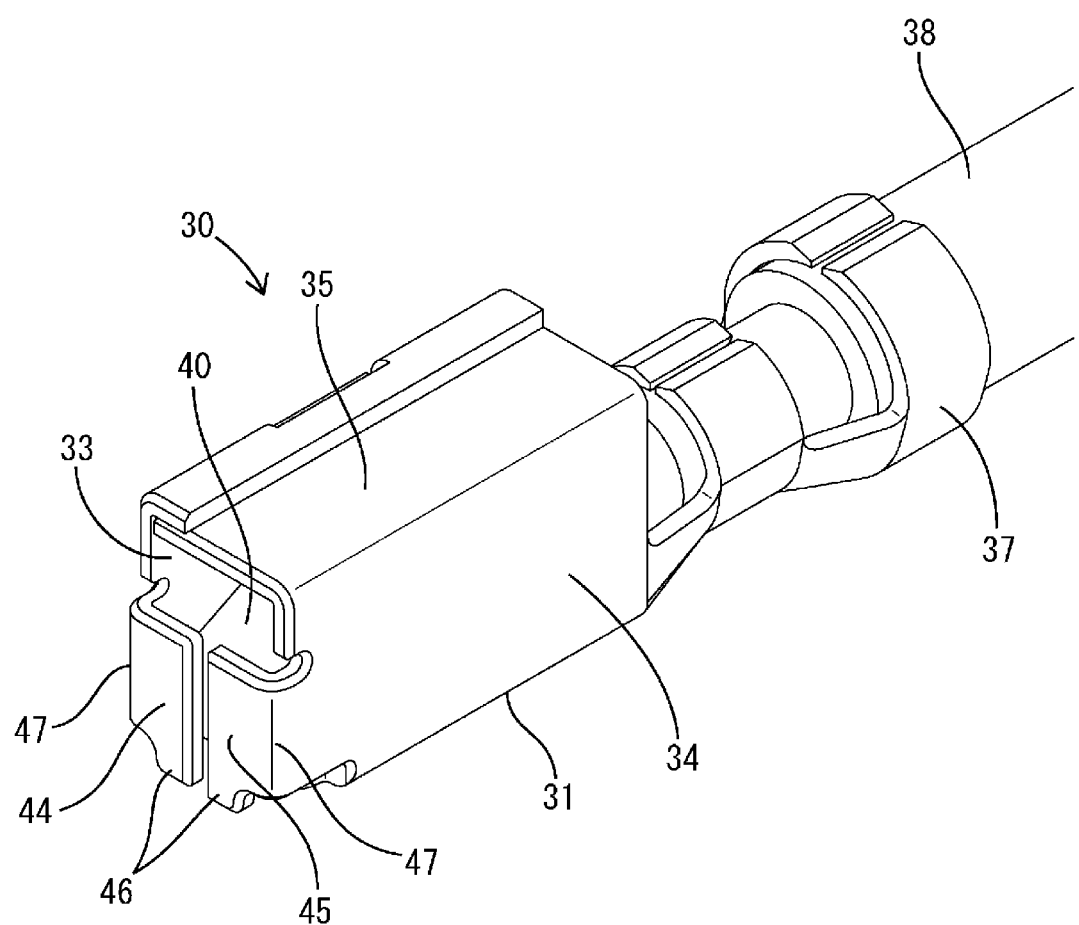
FIG. 4 is a perspective view of the terminal fitting.
Figure 5:
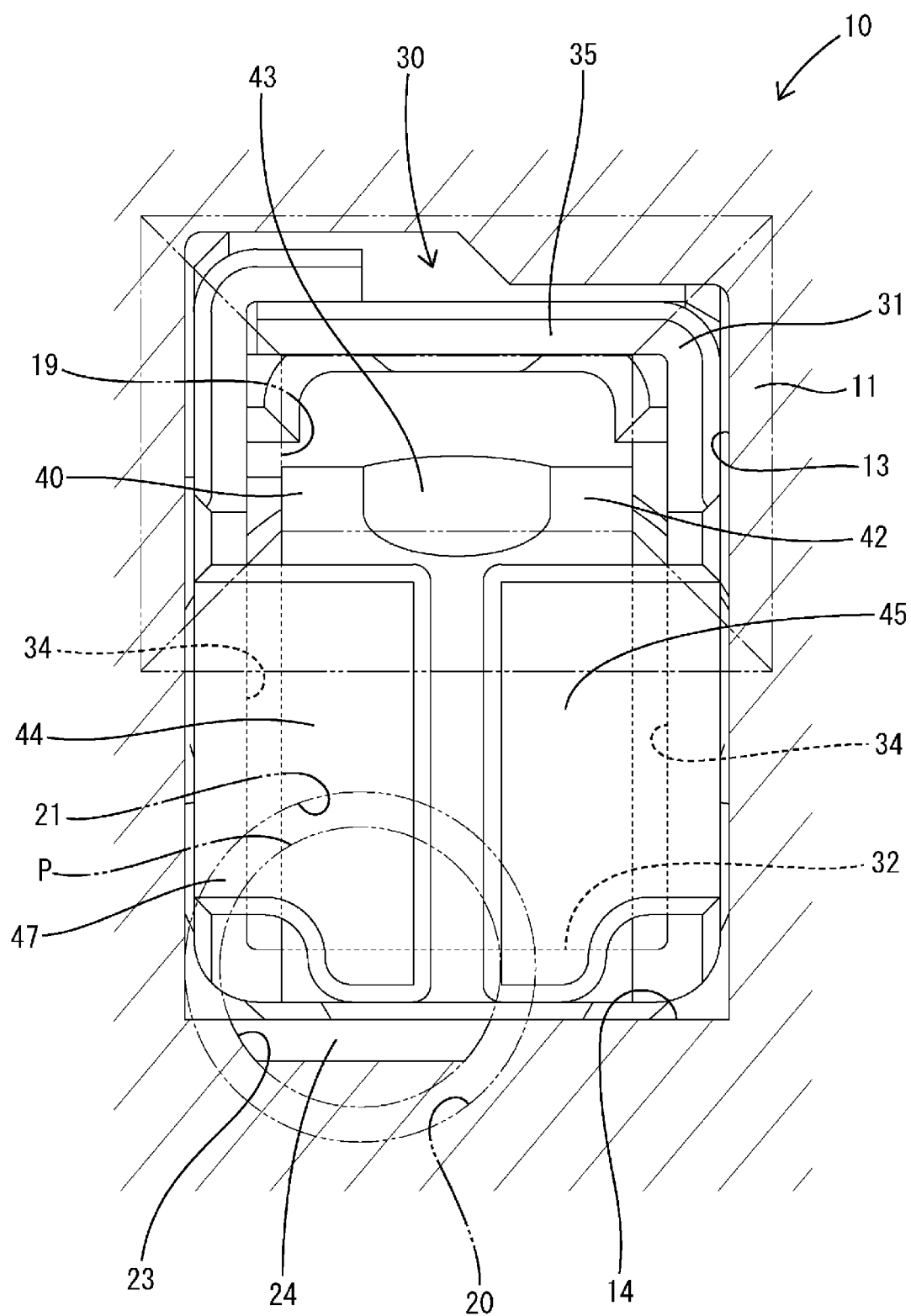
FIG. 5 is a front view in section showing the state where the detection pin is in contact with the front plate portion of the terminal fitting.

The connector of the first embodiment includes a housing 10 (see FIGS. 1 and 2) and a plurality of terminal fittings 30 (see FIGS. 2 to 4). The housing 10 includes a housing body 11 made of synthetic resin and a retainer 12 made of synthetic resin and mounted on a rear end part of the housing body 11 and has a rectangular parallelepiped shape long in the lateral direction as a whole. A plurality of terminal accommodation chambers 13 elongated in the front-rear direction are formed side by side in the lateral direction in the housing 10. The terminal fitting 30 is inserted into each terminal accommodation chamber 13 from behind the housing 10. Note that, in the following description, the lateral direction and a parallel direction of the terminal accommodation chambers 13 are used as synonyms.

As shown in FIGS. 2 and 3, the housing 10 includes a bottom wall portion 15 constituting a bottom surface 14 (inner surface as claimed) of the terminal accommodation chamber 13. The bottom wall portion 15 is formed with a locking lance 16 cantilevered forward (in the same direction as an inserting direction of the terminal fitting 30 into the terminal accommodation chamber 13). The locking lance 16 is resiliently displaceable in the vertical direction (direction orthogonal to an extending direction of the locking lance 16) with a rear end part of the locking lance 16 as a fulcrum while facing the terminal accommodation chamber 13. A front end part of the locking lance 16 functions as a retaining portion 17 for retaining the terminal fitting 30. If the locking lance 16 is resiliently displaced in the vertical direction, the retaining portion 17 is displaced along an arcuate path. Note that, in the following description, the vertical direction and a resilient displacing direction of the locking lance 16 are used as synonyms.

The housing 10 includes a front wall portion 18 constituting a front surface portion of the terminal accommodation chamber 13. In the first embodiment, the front wall portion 18 is a wall portion constituting the front surface of the housing 10, out of an outer wall portion of the housing 10. In the first embodiment, a range of the front surface of the housing 10 from the upper surface to the lower surface of the housing 10 is defined as the front wall portion 18. The front wall portion 18 extends in a region above the terminal accommodation chambers 13 and a region below the terminal accommodation chambers 13.

The front wall portion 18 is formed with a plurality of tab insertion holes 19 individually facing the plurality of terminal accommodation chambers 13. The tab insertion hole 19 penetrates through the front wall portion 18 in the front-rear direction and extends from the front surface of the housing 10 to the front end of the terminal accommodation chamber 13. In the vertical direction, the tab insertion hole 19 is disposed in an upper part of the front wall portion 18. As shown by an imaginary line in FIG. 5, the tab insertion hole 19 is disposed in a lateral center of the terminal accommodation chamber 13. As shown in FIG. 2, a tab T of a mating terminal is inserted into the tab insertion hole 19 from the front of the housing 10.

The front wall portion 18 is formed with a plurality of detection holes 20 individually facing the plurality of terminal accommodation chambers 13. As shown in FIGS. 2 and 3, the detection hole 20 has an axial direction oriented in the front-rear direction and penetrates through the front wall portion 18 in the front-rear direction. The detection hole 20 allows the front surface of the housing 10 and the front end of the terminal accommodation chamber 13 to communicate. The detection hole 20 and the tab insertion hole 19 do not directly communicate with each other and constitute holes independent of each other.

In the vertical direction, the detection hole 20 is disposed at a position separated downward from the tab insertion hole 19 (in a lower part of the front wall portion 18). An axis of the detection hole 20 is located substantially at the same height as the bottom surface 14 of the terminal accommodation chamber 13 (upper surface of the bottom wall portion 15). In particular, the axis of the detection hole 20 is located slightly above the bottom surface 14 of the terminal accommodation chamber 13. As shown in FIGS. 1 and 5, the detection hole 20 is disposed at a position eccentric from and to the left of the tab insertion hole 19 in a front view.

As shown in FIGS. 2 and 3, the detection hole 20 includes a fixed-diameter hole portion, a guiding portion 22 and a guide hole portion 23. The fixed-diameter hole portion 21 constitutes a major region of the detection hole 20. The fixed-diameter hole portion 21 has a circular cross-sectional shape perpendicular to an axis. An inner diameter of the fixed-diameter hole portion 21 is constant from the front end to the rear end of the fixed-diameter hole portion 21. The guiding portion 22 is connected to the front end of the fixed-diameter hole portion 21 and disposed in a front end part of the detection hole 20. The guiding portion 22 has a conical shape expanded in diameter toward a front side, concentrically with the fixed-diameter hole portion 21. The front end of the guiding portion 22 is open in the front surface of the housing 10. That is, the detection hole 20 forms a circular opening in the front wall portion 18 (front surface of the housing 10).

The guide hole portion 23 is connected to the rear end of the fixed-diameter hole portion 21 and constitutes a rear end part of the detection hole 20. The guide hole portion 23 is disposed only in a region behind the front wall portion 18 (front end of the terminal accommodation chamber 13) in the front-rear direction. Thus, a formation region of the detection hole 20 in the front-rear direction is a range from the front end of the front wall portion 18 to a position behind the rear end of the front wall portion 18 (front end of the terminal accommodation chamber 13).

Since the axis of the detection hole 20 is disposed at a position slightly above the bottom surface 14 of the terminal accommodation chamber 13, a cross-sectional shape of the guide hole portion 23 perpendicular to an axis is non-circular. The guide hole portion 23 is open upward in the bottom surface 14 of the terminal accommodation chamber 13. The rear end of the fixed-diameter hole portion 21 is open rearward in the front surface of the terminal accommodation chamber 13. A guide slope 24 inclined to be gradually higher toward a rear side is formed in a lower half region of the inner periphery of the guide hole portion 23. The guide slope 24 is inclined to reduce a height difference from the bottom surface 14 of the terminal accommodation chamber 13 toward the rear side. The guide slope 24 is formed by recessing the bottom surface 14 (inner surface) of the terminal accommodation chamber 13.

As shown in FIGS. 2 to 4, the terminal fitting 30 is a female terminal including a tube portion 31 and a crimping portion 37. The tube portion 31 includes a base plate portion 32 (lower plate portion), a left side plate portion 33 (plate-like portion as claimed), a right side plate portion 34 and an upper plate portion 35. Since the base plate portion 32, the left side plate portion 33, the right side plate portion 34 and the upper plate portion 35 are in the form of flat plates, the tube portion 31 has a rectangular tube shape with open front and rear ends. That is, in a front view of the terminal fitting 30, the tube portion 31 is rectangular. A projection 36 projecting downward (on an outer surface side of the tube portion 31) is formed on a front end part of the base plate portion 32. The crimping portion 37 is in the form of an open barrel and connected to the rear end of the tube portion 31. The crimping portion 37 is conductively crimped to a front end part of a wire 38.

As shown in FIGS. 2 and 3, the terminal fitting 30 includes a resilient contact piece 40. The resilient contact piece 40 is arcuately folded rearward from the front end of the base plate portion 32, extends rearward and is accommodated in the tube portion. The resilient contact piece 40 is resiliently displaceable in the vertical direction (directions toward and away from the base plate portion 32) with a folded portion 41 (front end part) leading to the base plate portion 32 as a fulcrum. The resilient contact piece 40 includes a curved portion 42 connected to the rear end of the folded portion 41. The curved portion 42 projects upward away from the base plate portion 32. An upper end part of the curved portion 42 facing and at a shortest distance from the upper plate portion 35 serves as a contact point portion 43 capable of contacting the tab T.

As shown in FIGS. 4 and 5, the terminal fitting 40 includes bilaterally symmetrical left front plate portion 44 (front plate portion as claimed) and right front plate portion 45. The left front plate portion 44 is cantilevered rightward at a right angle to the left side plate portion 33 from the front end edge of the left side plate portion 33 (plate-like portion different from the base plate portion 32 connected to the resilient contact piece 40). The right front plate portion 45 is cantilevered leftward at a right angle to the right side plate portion 34 from the front end edge of the right side plate portion 34 (plate-like portion different from the base plate portion 32 connected to the resilient contact piece 40). In a front view, the left and right front plate portions 44, 45 are arranged laterally side by side at a distance from each other in a laterally central part of the tube portion 31. The left and right front plate portions 44, 45 are both located forward of the front end (folded portion 41) of the resilient contact piece 40 and protect at least the folded portion 41 of the resilient contact piece 40 from front.

The left front plate portion 44 has a rectangular front view shape with long sides oriented in the vertical direction as a whole. In particular, a protrusion 46 in flush with the left front plate portion 44 projects downward on a right end part (extending end part) of the lower edge of the left front plate portion 44. The lower edge of the protrusion 46 is located at the same height as the lower surface (outer surface) of the base plate portion 32. A lateral dimension of the left front plate portion 44 is slightly smaller than half the width of the tube portion 31. The upper edge of the left front plate portion 44 is located below (toward the base plate portion 32) the contact point portion 43 of the resilient contact piece 40 and the lower edge of the tab insertion hole 19. Out of the left front plate portion 44, the lower end of a base end part 47 connected to the left side plate portion 33 is located above the upper surface of the base plate portion 32.

The right front plate portion 45 has a rectangular front view shape with long sides oriented in the vertical direction as a whole. In particular, a protrusion 46 in flush with the right front plate portion 45 projects downward on a left end part (extending end part) of the lower edge of the right front plate portion 45. The lower edge of the protrusion 46 is located at the same height as the lower surface (outer surface) of the base plate portion 32. A lateral dimension of the right front plate portion 45 is slightly smaller than half the width of the tube portion 31. The upper edge of the right front plate portion 45 is located below (toward the base plate portion 32) the contact point portion 43 of the resilient contact piece 40 and the lower edge of the tab insertion hole 19. Out of the right front plate portion 45, the lower end of a base end part 47 connected to the right side plate portion 33 is located above the upper surface of the base plate portion 32.

The terminal fitting 30 is inserted into the terminal accommodation chamber 13 from behind the housing 10. In an insertion process of the terminal fitting 30, the locking lance 16 interferes with the projection 36 to be resiliently deformed downward. Since the projection 36 passes over the locking lance 16 when the terminal fitting 30 is inserted to a proper position, the locking lance 16 resiliently returns upward and the retaining portion 17 faces the projection 36 from behind. Therefore, when the terminal fitting 30 is going to be displaced rearward from the proper insertion position, the projection 36 butts against the retaining portion 17, whereby the terminal fitting 30 is retained.

The retaining portion 17 (front end of the locking lance 16) when the locking lance 16 is resiliently deformed in the insertion process of the terminal fitting 30 is located more rearward than the retaining portion 17 when the locking lance 16 is not resiliently deformed. Accordingly, a clearance S is formed in the front-rear direction between the projection 36 and the retaining portion 17 in a state where the terminal fitting 30 is properly inserted and can be retained by the locking lance 16. Thus, the terminal fitting 30 in the properly inserted state is movable in the front-rear direction with respect to the housing 10 by as much as the clearance S between a foremost end position (see FIG. 2) where the left and right front plate portions 44, 45 are in contact with the front wall portion 18 and a rearmost end position (see FIG. 3) where the projection 36 is in contact with the retaining portion 17 (front end of the locking lance 16).

When the connector having the terminal fittings 30 properly inserted therein and a mating connector (not shown) are connected, the tabs T of the mating terminals pass through the tab insertion holes 19, are inserted into the tube portions 31 and enter between the contact point portions 43 and the upper plate portions 35 while resiliently deforming the resilient contact pieces 40 downward. In this way, the tabs T are sandwiched between the upper plate portions 35 and the contact point portions 43 and resiliently connected to the terminal fittings 30.

A positional relationship of the detection hole 20 and the properly inserted terminal fitting 30 is as follows. As shown in FIG. 5, a part of a lower end part of the left front plate portion 44 including the protrusion 46 and a part of a lower end part of the right front plate portion 45 are disposed in an opening region of the fixed-diameter hole portion 21 of the detection hole 20. The fixed-diameter hole portion 21 of the detection hole 20 is facing a region of the left front plate portion 44 including a lower end part of the base end part 47 connected to the left side plate portion 33. In other words, the detection hole 20 is facing a part of the left front plate portion 44 eccentric toward the left side plate portion 33 from a right edge part (leading edge part in an extending direction from the left side plate portion 33 and a central part of the tube portion 31 in a front view). The rear end of the detection hole 20 is open to face also a region of the terminal fitting 30 where the front plate portion is not formed.

Continuity inspection is carried out after the terminal fittings 30 are inserted into the terminal accommodation chambers 13. At the time of the continuity inspection, a rod-like detection pin P having a circular cross-section is inserted from the front of the housing 10. An outer diameter of the detection pin P is smaller than a diameter (inner diameter) of the fixed-diameter hole portion 21 and larger than a radius of the fixed-diameter hole portion 21. Further, the tapered guiding portion 22 is formed in the front end part of the detection hole 20. Accordingly, even if the detection pin P is shifted in position in the vertical or lateral direction with respect to the detection hole 20, the detection pin P is reliably inserted into the detection hole 20.

The detection pin P inserted into the detection hole 20 advances in the fixed-diameter hole portion 21 and contacts the lower end part of the left front plate portion 44. If a detection circuit is closed when the detection pin P contacts the left front plate portion 44, it is judged that the terminal fitting 30 is inserted in the appropriate terminal accommodation chamber 13. Unless the detection circuit is closed, it is judged that the terminal fitting 30 is not inserted in the appropriate terminal accommodation chamber 13.

If the detection pin P is inserted into the detection hole 20 and pushes the left front plate portion 44, the terminal fitting 30 moves rearward by as much as the clearance S between the projection 36 and the locking lance 16 and, during this time, the detection pin P slides in contact with the guide slope 24. Since the guide slope 24 is inclined to approach the left front plate portion 44 from below toward the rear side, a contact area of the detection pin P and the left front plate portion 44 increases as the terminal fitting 30 moves rearward.

The connector of the first embodiment includes the housing 10 having the plurality of terminal accommodation chambers 13 and the plurality of terminal fittings 30 inserted into the terminal accommodation chambers 13. The terminal fitting 30 includes the tube portion 31 and the resilient contact piece 40 accommodated in the tube portion 31. The front wall portion 18 of the housing 10 is formed with the tab insertion holes 19 into which the tabs T of the mating terminals are inserted to enter the tube portions 31 and contact the resilient contact pieces 40 from front. That is, the tabs T inserted into the tab insertion holes 19 from the front of the housing 10 enter the tube portions 31 and contact the resilient contact pieces 40. The left front plate portion 44 is formed forward of the resilient contact piece 40 in the terminal fitting 30. The front wall portion 18 of the housing 10 is formed with the detection holes 20 open separately from the tab insertion holes 19. The detection holes 20 are disposed at the positions facing the left front plate portions 44 in the front wall portion 18. That is, the openings of the tab insertion hole 19 and the openings of the detection holes 20 do not directly communicate with each other and are in a non-communication state in a front view.

According to the connector of the first embodiment, the detection pin P is inserted into the detection hole 20 and brought into contact with the left front plate portion 44 at the time of the continuity inspection. Since the left front plate portion 44 is located forward of the resilient contact piece 40, there is no possibility that the detection pin P contacts the resilient contact piece 40. Since the detection hole 20 is open separately from the tab insertion hole 19 and the detection hole 20 and the tab insertion hole 19 do not communicate with each other, there is also no possibility that the detection pin P inserted into the detection hole 20 erroneously enters the tab insertion hole 19 to contact the resilient contact piece 40. Therefore, according to the connector of the first embodiment, the damage and deformation of the resilient contact piece 40 due to the contact of the detection pin P can be prevented.

The left front plate portion 44 is cantilevered from the left side plate portion 33 constituting the tube portion 33. In view of this form, the detection hole 20 is disposed eccentrically toward the left side plate portion 33 from a center of a cross-section of the tube portion 31 orthogonal to an entering direction of the tab T (center of the tube portion 31 in a front view). In this way, the detection pin P pushes not a part of the left front plate portion 44 near the extending end part (right end part), but a part of the left front plate portion 44 on the side of the base end part 47 connected to the left side plate portion 33. Therefore, there is no possibility that the left front plate portion 44 is deformed rearward even if being pushed by the detection pin P.

The detection hole 20 is facing the region of the left front plate portion 44 including the base end part 47 connected to the left side plate portion 33. According to this configuration, since the detection pin P pushes the base end part 47 connected to the left side plate portion 33, out of the left front plate portion 44, the rearward deformation of the left front plate portion 44 can be reliably prevented when the left front plate portion 44 is pushed by the detection pin P.

The left front plate portion 44 is formed to cover at least a part (folded portion 41) of the resilient contact piece 40 together with the right front plate portion 45 from front. According to this configuration, also in a state where the terminal fitting 30 is located outside the terminal accommodation chamber 13, the damage and deformation of the resilient contact piece 40 (particularly, the folded portion 41) due to the interference of an external matter can be prevented. The folded portion 41 is an important part for specifying a resilient restoring force of the resilient contact piece 40, i.e. a contact pressure with the tab T. Therefore, functions of the terminal fitting 30 can be prevented from being impaired by covering and protecting the folded portion 41 by the left and right front plate portions 44, 45.

Since the inner diameter of the front end of the detection hole 20 is set larger than the outer diameter of the detection pin P, the detection pin P can be reliably inserted into the detection hole 20. On the other hand, the rear end of the detection hole 20 is open to face a region of the front end part of the terminal fitting 30 where the left front plate portion 44 is not formed, i.e. a region below the base end part 47 of the left front plate portion 44 (quarter-circular portion on a left-lower corner of the tube portion 31 in FIG. 5) in the front-rear direction. Thus, it may not be possible to secure a sufficient contact area of the detection pin P and the left front plate portion 44.

Accordingly, in the first embodiment, the guide slope 24 inclined obliquely upward to approach the left front plate portion 44 toward the rear side is formed on the rear end part (guide hole portion 23) of the inner peripheral surface of the detection hole 20. According to this configuration, the detection pin P inserted into the detection hole 20 can reliably contact the left front plate portion 44 by sliding in contact with the guide slope 24.

The terminal fitting 30 is retained by the locking lance 16 resiliently displaceably formed in the terminal accommodation chamber 13. Thus, the clearance S is unavoidably formed in the front-rear direction between the terminal fitting 30 and the resiliently displaceable locking lance 16, and the terminal fitting 30 is displaceable in the front-rear direction by as much as this clearance S. In view of this point, the guide slope 24 is formed by recessing the inner surface of the terminal accommodation chamber 13. According to this configuration, the detection pin P can increase the contact area with the left front plate portion 44 by sliding in contact with the guide slope 24 in the process of the terminal fitting 30 moving rearward by as much as the clearance S between the terminal fitting 30 and the locking lance 16 by being pushed by the detection pin P.

Second Embodiment

Figure 6:
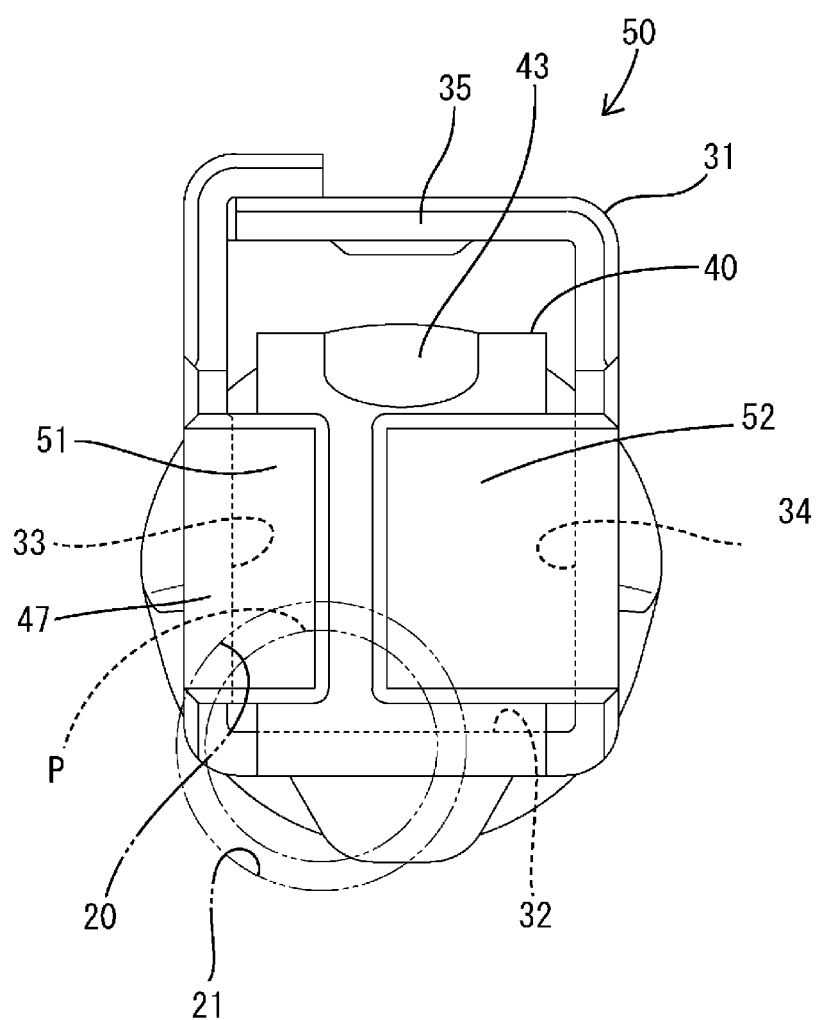
FIG. 6 is a front view of a terminal fitting of a second embodiment.

A second specific embodiment of the present disclosure is described with reference to FIG. 6. The second embodiment is different from the first embodiment in the configurations of a left front plate portion 51 (front plate portion as claimed) and a right front plate portion 52 of a terminal fitting 50. Since the other components are the same as in the first embodiment, the same components are denoted by the same reference signs and structures, functions and effects thereof are not described.

The left front plate portion 51 is cantilevered rightward at a right angle to a left side plate portion 33 from the front end edge of the left side plate portion 33. The right front plate portion 52 is cantilevered leftward at a right angle to a right side plate portion 34 from the front end edge of the right side plate portion 34. An extension dimension of the left front plate portion 51 from the left side plate portion 33 is smaller than that of the right front plate portion 52 from the right side plate portion 34. That is, the left and right front plate portions 51, 52 are bilaterally asymmetrical. The left and right front plate portions 51, 52 are arranged laterally side by side at a distance from each other on a side to the left of a lateral center of a tube portion 31.

A part of a lower end part of the left front plate portion 51 and a part of a lower end part of the right front plate portion 52 are disposed in an opening region of a fixed-diameter hole portion 21 of a detection hole 20. The fixed-diameter hole portion 21 of the detection hole 20 is facing a region of the left front plate portion 51 including a lower end part of a base end part 47 connected to the left side plate portion 33. In the opening region of the fixed-diameter hole portion 21, an area occupied by the left front plate portion 51 is larger than that occupied by the right front plate portion 52. However, the extension dimension of the left front plate portion 51 from the left side plate portion 33 is smaller than in the first embodiment. Therefore, the left front plate portion 51 is less likely to be deformed rearward when the detection pin P pushes the left front plate portion 51.

Third Embodiment

Figure 7:
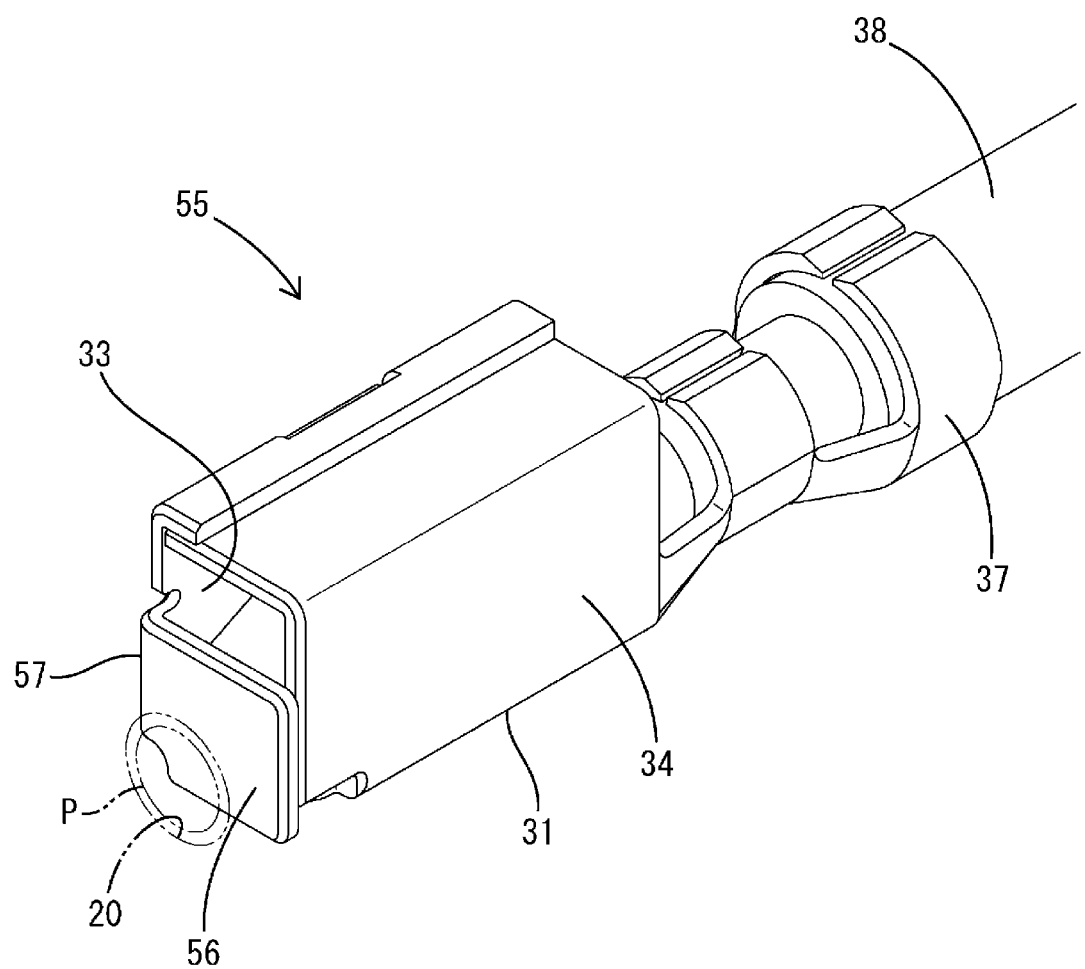
FIG. 7 is a perspective view of a terminal fitting of a third embodiment.

A third specific embodiment of the present disclosure is described with reference to FIG. 7. The third embodiment is different from the first embodiment in the configuration of a left front plate portion 56 of a terminal fitting 55. Since the other components are the same as in the first embodiment, the same components are denoted by the same reference signs and structures, functions and effects thereof are not described.

The terminal fitting 55 of the third embodiment includes only one front plate portion 56. The front plate portion 56 is cantilevered rightward at a right angle to a left side plate portion 33 from the front end edge of the left side plate portion 33. An extending end edge part (right end edge part) of the front plate portion 56 is proximately facing the front end edge of a right side plate portion 34 from front or in contact with the front end edge of the right side plate portion 34 to cover the front end edge of the right side plate portion 34 from front. The front plate portion 56 is supported on a tube portion 31 at two positions on a base end part 57 (left end edge part) and the extending end part (right end edge part). Therefore, even if a detection pin P pushes the front plate portion 56 rearward, there is no possibility that the front plate portion 56 is deformed rearward.

Fourth Embodiment

Figure 8:
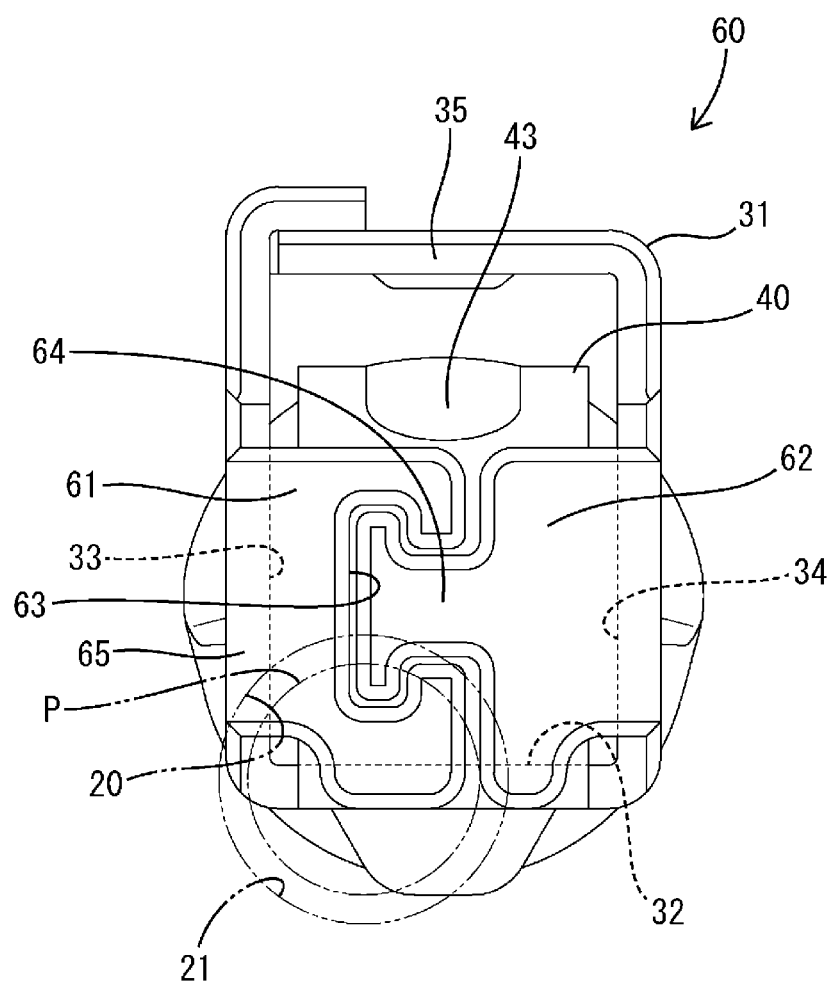
FIG. 8 is a front view of a terminal fitting of a fourth embodiment.

A fourth specific embodiment of the present disclosure is described with reference to FIG. 8. The fourth embodiment is different from the first embodiment in the configurations of a left front plate portion 61 (front plate portion as claimed) and a right front plate portion 62 of a terminal fitting 60. Since the other components are the same as in the first embodiment, the same components are denoted by the same reference signs and structures, functions and effects thereof are not described.

The left front plate portion 61 is cantilevered rightward at a right angle to a left side plate portion 33 from the front end edge of the left side plate portion 33. The right front plate portion 62 is cantilevered leftward at a right angle to a right side plate portion 34 from the front end edge of the right side plate portion 34. An extension dimension of the left front plate portion 61 from the left side plate portion 33 is larger than half the width of a tube portion 31. An extension dimension of the right front plate portion 62 from the right side plate portion 34 is also larger than half the width of the tube portion 31.

The left front plate portion 61 is formed with a fitting recess 63 having a lying T shape in a front view. The right front plate portion 62 is formed with a fitting projection 64 having a lying T shape in the front view. Since the fitting recess 63 and the fitting projection 64 are fit to each other, relative displacements of the left and right front plate portions 61, 62 in the vertical direction and lateral direction are restricted.

A part of a lower end part of the left front plate portion 61, a part of a lower end part of the right front plate portion 62 and a part of the fitting projection 64 are disposed in an opening region of a fixed-diameter hole portion 21 of a detection hole 20. The fixed-diameter hole portion 21 of the detection hole 20 is facing a region of the left front plate portion 61 including a lower end part of a base end part 65 connected to the left side plate portion 33. In the opening region of the fixed-diameter hole portion 21, an area occupied by the left front plate portion 61 is larger than that occupied by the right front plate portion 62.

OTHER EMBODIMENTS

The present invention is not limited to the above described and illustrated embodiments and is represented by claims. The present invention is intended to include all changes in the scope of claims and in the meaning and scope of equivalents and also include the following embodiments.

Although the detection pin is facing the part of the front plate portion eccentric toward the plate-like portion from the center of the tube portion in the front view in the above first to fourth embodiments, the detection hole may be facing a part of the front plate portion located in the center of the tube portion in the front view.

Although the resilient contact piece is folded to extend from the base plate portion and the front plate portion extends from the plate-like portion different from the base plate portion in the above first to fourth embodiments, the front plate portion may extend from the base plate portion.

Although the detection hole is facing the region of the front plate portion including the base end part connected to the plate-like portion in the above first to fourth embodiments, the detection hole may be facing only a region of the front plate portion deviated from the base end part.

Although the front plate portion covers at least a part of the resilient contact piece from front in the above first to fourth embodiments, the front plate portion may not cover the resilient contact piece from front.

Although the rear end of the detection hole is open to face the region of the terminal fitting where the front plate portion is not formed in the above first to fourth embodiments, the rear end of the detection hole may be open to face only the front plate portion without facing the region of the terminal fitting where the front plate portion is not formed.

Although the guide slope is formed on the inner periphery of the detection hole in the above first to fourth embodiments, the guide slope may not be formed.

Although the guide slope is formed only in the region of the detection hole on the rear end side in the above first to fourth embodiments, the guide slope may be formed over an entire region from the front end to the rear end of the detection hole or may be formed only in a region of the detection hole on the front end side.

Although the guide slope is formed by recessing the inner surface of the terminal accommodation chamber in the above first to fourth embodiments, the guide slope may be formed only in a region forward of the front end of the terminal accommodation chamber without recessing the inner surface of the terminal accommodation chamber.

Although the tube portion is in the form of a rectangular tube with four flat plate portions in the above first to fourth embodiments, the tube portion may be shaped to have curved plate portions.

LIST OF REFERENCE NUMERALS

10: housing
11: housing body
12: retainer
13: terminal accommodation chamber
14: bottom surface (inner surface)
15: bottom wall portion
16: locking lance
17: retaining portion
18: front wall portion
19: tab insertion hole
20: detection hole
21: fixed-diameter hole portion
22: guiding portion
23: guide hole portion
24: guide slope
30, 50, 55, 60: terminal fitting
31: tube portion
32: base plate portion
33: left side plate portion
34: right side plate portion
35: upper plate portion
36: projection
37: crimping portion
38: wire
40: resilient contact piece
41: folded portion
42: curved portion
43: contact point portion
44, 51, 61: left front plate portion (front plate portion)
45, 52, 62: right front plate portion
46: protrusion
47, 57: base end part of left front plate portion
56: front plate portion 63: fitting recess
64: fitting projection
65: base end part of left front plate portion
P: detection pin
S: clearance
T: tab

What is claimed is:

1. A connector, comprising:
a housing including a terminal accommodation chamber; and
a terminal fitting including a tube portion and a resilient contact piece accommodated in the tube portion, the terminal fitting being inserted into the terminal accommodation chamber,
wherein:
a front wall portion of the housing is formed with a tab insertion hole, a tab of a mating terminal being inserted into the tab insertion hole to enter the tube portion from front and contact the resilient contact piece,
a front plate portion is formed forward of the resilient contact piece in the terminal fitting,
the front wall portion of the housing is formed with a detection hole open separately from the tab insertion hole, a detection pin being inserted into the detection hole,
the detection hole is disposed at a position facing the front plate portion in the front wall portion,
the terminal fitting is retained by a resiliently displaceable locking lance formed in the terminal accommodation chamber,
the terminal fitting retained by the locking lance is movable forward and rearward by as much as a clearance between a foremost end position where the front plate portion is in contact with the front wall portion and a rearmost end position where the terminal fitting is in contact with the locking lance,
a guide slope inclined to approach the front plate portion toward a rear side is formed on a rear end part of an inner periphery of the detection hole, the detection pin being caused to slide in contact with the guide slope, and
a contact area of the front plate portion with the detection pin increases as the terminal fitting is moved rearward by the detection pin pushing the front plate portion while sliding in contact with the guide slope.

2. The connector of claim 1, wherein:
the front plate portion is cantilevered from a plate-like portion constituting the tube portion, and
the detection hole is disposed eccentrically from a center of a cross-section of the tube portion orthogonal to an entering direction of the tab.

3. The connector of claim 2, wherein the detection hole is facing a region of the front plate portion including a base end part connected to the plate-like portion.

4. The connector of claim 1, wherein the front plate portion covers at least a part of the resilient contact piece from front.

5. The connector of claim 1, wherein the guide slope is formed by recessing an inner surface of the terminal accommodation chamber.

* * * * *